United States Patent [19]

Tokumo et al.

[11] Patent Number: 4,992,749
[45] Date of Patent: Feb. 12, 1991

[54] PULSE-WIDTH MODULATING AMPLIFIER CIRCUIT

[75] Inventors: Akio Tokumo; Masayuki Kato; Takeshi Sato; Tatsuzo Hasegawa, all of Saitama, Japan

[73] Assignee: Pioneer Electronic Corporation, Tokyo, Japan

[21] Appl. No.: 450,882

[22] Filed: Dec. 14, 1989

[30] Foreign Application Priority Data

Dec. 28, 1988 [JP] Japan .............................. 63-328809

[51] Int. Cl.[5] .............................................. H03F 3/38
[52] U.S. Cl. ........................................ 330/10; 330/251
[58] Field of Search .................... 330/10, 156, 207 A, 330/251, 264, 277, 290, 302, 306

[56] References Cited

U.S. PATENT DOCUMENTS

| | | | |
|---|---|---|---|
| 3,384,830 | 5/1968 | De Niet | 330/251 |
| 4,173,739 | 11/1979 | Yoshida | 330/251 X |
| 4,178,556 | 12/1979 | Attwood | 330/10 |
| 4,463,318 | 7/1984 | Kaplan | 330/251 |
| 4,743,860 | 5/1988 | Dziagwa | 330/251 |
| 4,949,048 | 8/1990 | Tokumo et al. | 330/10 |

FOREIGN PATENT DOCUMENTS

| | | |
|---|---|---|
| 2507528 | 8/1975 | Fed. Rep. of Germany ... 330/207 A |
| 2558161 | 6/1976 | Fed. Rep. of Germany . |
| 2754268 | 8/1978 | Fed. Rep. of Germany . |
| 2752739 | 10/1978 | Fed. Rep. of Germany . |
| 2951920 | 7/1980 | Fed. Rep. of Germany . |

OTHER PUBLICATIONS

Patents Abstracts of Japan, Sep. 28, 1984, vol. 8, No. 213.

Design Considerations in Class D MOS Power Amplifiers, John Murray et al., in Transactions on Industrial Electronics & Control Instrumentation, vol. IECI-26, No. 4, Nov. 1979, pp. 211–218.

*Primary Examiner*—Steven Mottola
*Attorney, Agent, or Firm*—Sughrue, Mion, Zinn, Macpeak & Seas

[57] ABSTRACT

A pulse-width modulating amplifier circuit includes two bootstrap circuits for increasing the power voltage to drive circuits to prevent a drive voltage shortage. One bootstrap circuit is connected from the output of the a power amplifier to a drive circuit. The other bootstrap circuit is connected from the output of a filter demodulator to a drive circuit.

3 Claims, 2 Drawing Sheets

PULSE-WIDTH MODULATING AMPLIFIER CIRCUIT

BACKGROUND OF THE INVENTION

The present invention relates to a pulse-width modulating amplifier circuit and, more particularly, to an amplifier in which MOS FET's are used for the pulse amplifier for power-amplifying a pulse-width signal.

There are pulse-width modulating amplifiers (referred to as PWM amplifiers) which modulate a high frequency triangular-wave carrier signal with an analog signal, such as an audio signal, into a pulse-width signal and power-amplify the pulse-width signal, and which demodulate the amplified pulse-width signal by eliminating the carrier signal with a filter before it is applied to a load such as a speaker. Those amplifiers are very efficient in power amplification and thus they have come to be used in automobile audio devices.

In FIG. 1, which is an example of a conventional PWM amplifier, an input terminal 1 is provided for receiving an analog signal. The analog signal is applied to the inverted input terminal of a comparator 2, while to its non-inverted input terminal is applied the output signal from a high frequency (e.g., about 200 kHz) triangular-wave generator 3. Thus, this causes the carrier signal to be modulated with the analog signal into a pulse-width signal. After going through a drive amplifier 4, the pulse-width signal is amplified by a pulse amplifier (power amplifier) 5, consisting of power FET's of the N-channel MOS type, and thereafter is applied to a filter circuit consisting of a choke coil 6 and a condenser 7, wherein the carrier signal is eliminated. The audio output from the filter circuit drives a load, such as a speaker 9, connected to an output terminal 8.

As a known fact, in order to turn on a MOS FET it is necessary to apply to the gate thereof a voltage higher than the +B voltage which is applied to the drain thereof. Therefore, in such a configuration as above, where MOS FET's are used as the pulse amplifier 5, it is necessary for the drive amplifier 4 at the preceding stage to output a voltage higher than the +B voltage. However, with only the +B voltage, a drive voltage from the drive amplifier 4 becomes too low to drive the pulse amplifier 5 satisfactorily.

FIG. 2 shows an embodiment intended for solving this problem. In this embodiment FET's of the N-channel MOS type are connected in a push-pull configuration to form a pulse amplifier 12. Numeral 10 denotes the first complementary drive amplifier consisting of an NPN transistor $Q_1$ and a PNP transistor $Q_2$ and 11 denotes the second complementary drive amplifier consisting of an NPN transistor $Q_3$ and a PNP transistor $Q_4$. Outputs of the first and second drive amplifiers 10 and 11 are connected to gates of respective power FET's $Q_5$ and $Q_6$ composing the pulse amplifier 12.

A bootstrap circuit 13 consisting of a condenser $C_1$ and a diode $D_1$ is provided to give a bias to the preceding drive amplifier 10, which has a problem of a drive voltage shortage.

That is to say, the bootstrap circuit 13 is formed in such a way that the condenser $C_1$ has its one end connected with the output terminal of the pulse amplifier 12, the other end connected with the power voltage supplying line of the first drive amplifier 10. The power voltage supplying line is connected to a power source +B through the diode $D_1$.

Thus, the above-mentioned condenser $C_1$ is impressed with a positive (+) voltage via the diode $D_1$ as shown in the figure. Turning-on of the first power FET $Q_5$ causes the output terminal of the pulse amplifier 12 to shift to a voltage approximately equal to the power source voltage +B, so that the collector of the transistor $Q_1$ included in the first drive amplifier 10 is impressed with approximately twice the power source voltage +B. Therefore, in such a pulse amplifier consisting of N-channel MOS FET's, the problem of a drive voltage shortage in the drive amplifier can be prevented from occurring.

However, in the configuration as described above there still remains the following problem: In the case where the analog signal applied to the input terminal 1 in FIG. 1 is so large as to cause the modulation factor of pulse-width modulation in the comparator 2 to exceed 100%, the output of the comparator 2 does not become the pulse-width signal, but a DC signal having a positive maximum or negative maximum value. Accordingly, in the embodiment of FIG. 2, the output of the drive amplifiers 10 and 11 becomes a DC signal having a certain value. This means that the FET's $Q_5$ and $Q_6$ composing the pulse amplifier 12 remain on or off, that is, there appears no pulse signal at the output terminal of the pulse amplifier 12.

The condenser $C_1$ performs charging and discharging within a period of the carrier signal applied to the comparator 2. If the capacitance of the condenser $C_1$ is selected to be large, due to the charges stored in the condenser $C_1$ the first drive amplifier 10 is kept supplied with the power voltage higher than the power source voltage +B, even with the modulation factor which exceeds 100% in a short period. However, if the capacitance $C_1$ is too large, an excessive charging current is supplied to the condenser $C_1$ from the pulse amplifier 12 in synchronism with the carrier signal, causing a distortion in the output of the pulse amplifier 12 which results in a distortion in the demodulated audio output signal. Therefore, the capacitance $C_1$ should not have so large a value, and hence with the analog signal which would cause the modulation factor to exceed 100%, the pulse output of the pulse amplifier 12 is interrupted and the condenser $C_1$ is discharged completely in a short time.

Consequently, the bootstrap circuit consisting of the condenser $C_1$ and the diode D stops working, causing the PWM amplifier to be in the state of abnormal output.

SUMMARY OF THE INVENTION

The present invention is based on a consideration of the above-mentioned problems of PWM amplifiers. Therefore, it is an object of the present invention to provide a PWM amplifier which can be kept from a state of abnormal output even if the input becomes so large that the modulation factor exceeds 100%.

A pulse-width modulating amplifier circuit according to the invention is provided with a first bootstrap circuit giving the drive circuit a power voltage from the pulse amplifier output, and a second bootstrap circuit giving the above drive circuit another power voltage from the demodulated output, which has been obtained through a filter circuit.

Further objects and advantages of the present invention will be apparent from the following description of the preferred embodiment of the invention as illustrated in the accompanying drawings.

DETAILED DESCRIPTION OF THE PREFERRED EMBODIMENTS

Figure 3:
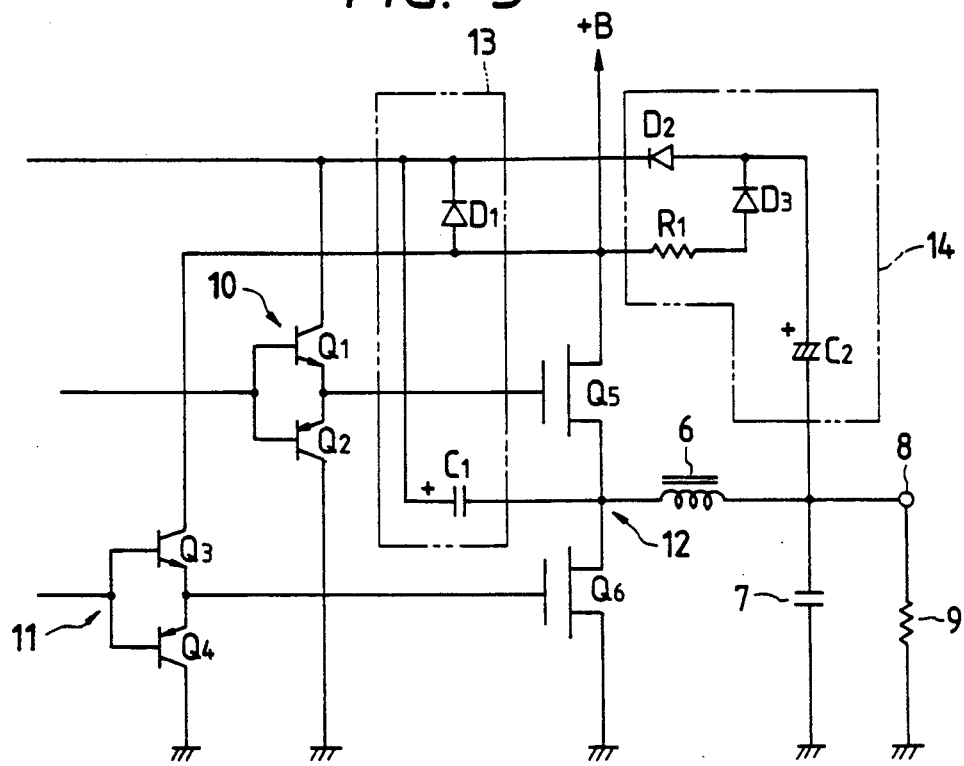
FIG. 3 is a wiring diagram showing a first embodiment of the present invention.

Referring to FIG. 3, a first embodiment of a pulse amplifier circuit of the present invention will be described below.

Figure 1:
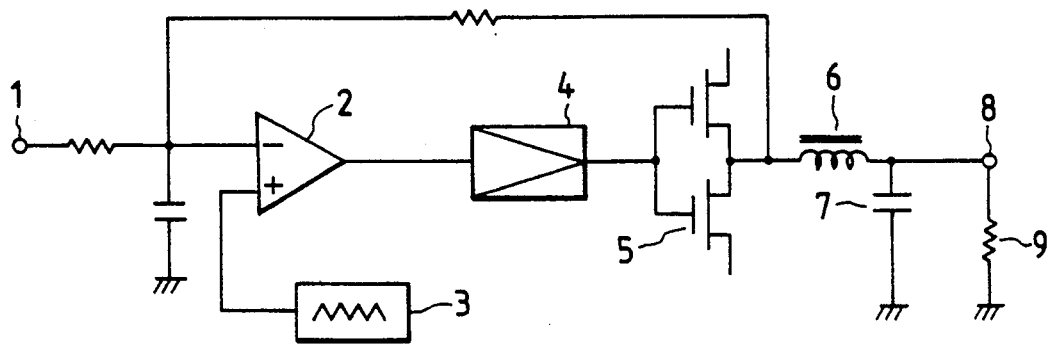
FIG. 1 is a block diagram showing the basic structure of a conventional PWM amplifier.
Figure 2:
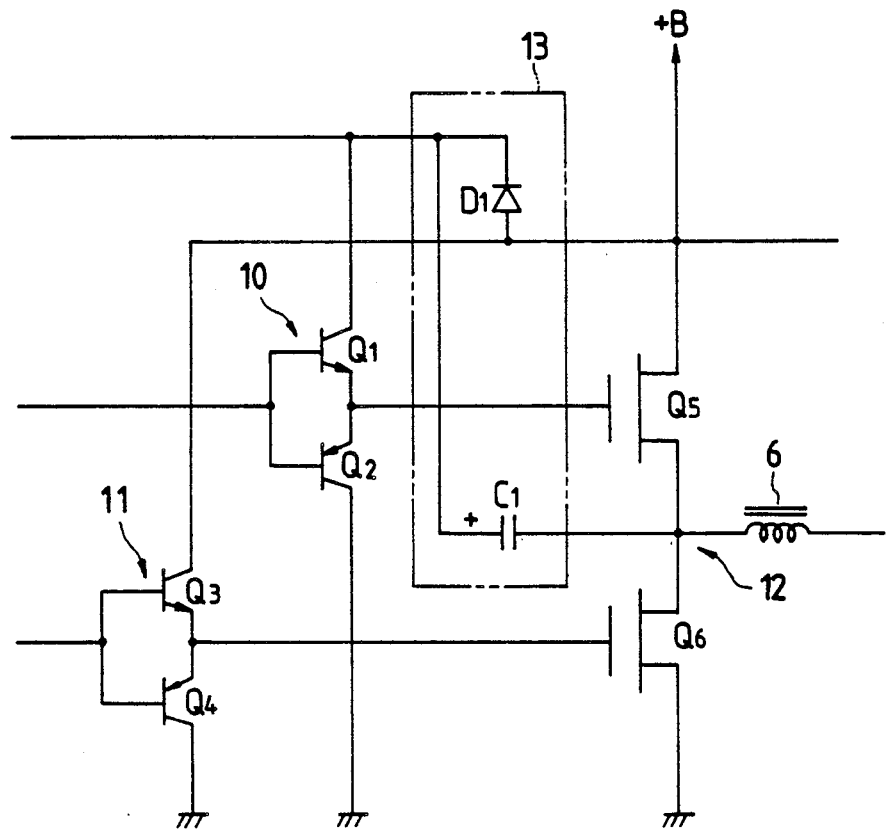
FIG. 2 is a wiring diagram showing an example of a conventional PWM amplifier.

The circuit of FIG. 3, as well as that of FIG. 1, includes a pulse amplifier 12 consisting of N-channel MOS FET's connected in a push-pull configuration. The same numerals found in both figures denote the same parts, so that explanations will be omitted for those parts.

The circuit of FIG. 3 is provided with a second bootstrap circuit 14 consisting of a condenser $C_2$, diodes $D_2$, $D_3$ and a resistor R in addition to the above first bootstrap circuit 13.

That is, the above condenser $C_2$ has its one end connected with a demodulated output terminal 8, which is connected to a filter circuit consisting of a choke coil 6 and a condenser 7, and the other end is connected with a power voltage supplying line of the first drive amplifier 10 through the diode $D_2$. The arrangement is so made that the condenser $C_2$ is supplied with a positive voltage (+) via a diode $D_3$ and a resistor $R_1$ from the power source +B.

In the above-mentioned composition, when the demodulated output of the PWM amplifier given at an output terminal 8 swings toward, for example, the positive direction, the demodulated output raises the potential of one end of the condenser $C_2$. This means that the potential rise is added to the positive potential due to the stored charges at the other end of the condenser $C_2$.

Thus, the resultant positive voltage ($\approx 1.5(+B)$) generated at the other end of $C_2$ is supplied to the power voltage supplying line of the first drive amplifier 10 via the diode $D_2$. At this time, diodes $D_1$ and $D_3$ are off because of their reversed biases.

When the first FET $Q_5$ turns on, the first drive amplifier 10 has a problem of drive voltage shortage. With the above configuration, when the first FET $Q_5$ turns on, the second bootstrap circuit 14 also provides a bias to the power voltage supplying line of the first drive amplifier 10.

Even though an analog signal input causes the modulation factor to exceed 100% and thereby stops the function of the first bootstrap circuit 13, the circuit herein will not exhibit an abnormal output state because the first drive amplifier 10 is supplied with enough power voltage owing to the operation of the second bootstrap circuit 14.

Thus, according to this embodiment, the first bootstrap circuit 13 works in the region of 0 to 100% modulation and the second bootstrap circuit 14 works in the region of several percent to more than 100% modulation.

However, since the condenser $C_1$ may be charged by a voltage larger than +B through the diode $D_2$, the embodiment of FIG. 3 still suffers from the following problems: First, a voltage applied between the gate and source of the FET $Q_5$ may exceed the FET's gate withstand voltage (typically about 20 V), causing the destruction of the FET $Q_5$. Second, since the drive voltage, i.e., the gate voltage of the FET $Q_5$ varies with the analog signal, some distortion may appear in the demodulated output signal.

Figure 4:
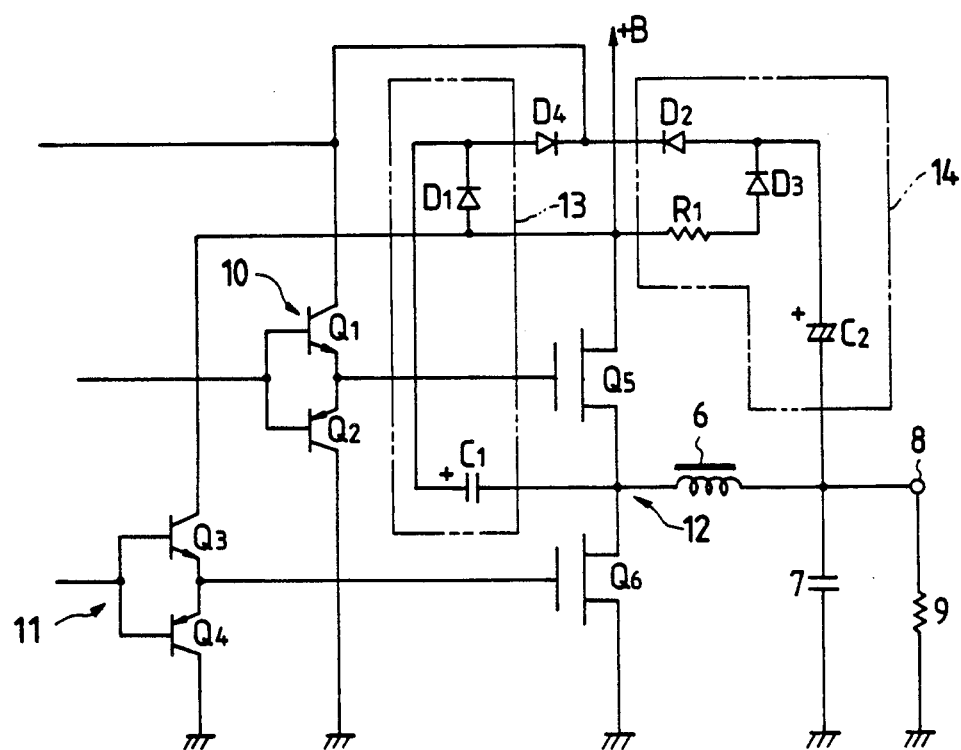
FIG. 4 is a wiring diagram showing a second embodiment of the present invention.

FIG. 4 shows a second embodiment of the invention to solve the above problems, which is characterized by the addition of a diode $D_4$ to the configuration of the first embodiment. By virtue of the existence of the diode $D_4$, the condenser $C_1$ is not charged through the diode $D_2$, but only charged through the diode $D_1$. The power supplying line of the drive amplifier 10 is supplied with a power voltage through either the diode $D_2$ or $D_4$ depending on the relation between the voltages at the ends of the condensers $C_1$ and $C_2$. Since the end voltages of the condensers $C_1$ and $C_2$ are less than 2 (+B) and approximately 1.5 (+B), respectively, the gate-source voltage of the FET $Q_5$ is kept within its gate withstand voltage. Furthermore, since the power voltage to the drive amplifier 10 is stabilized, the distortion characteristics of the analog output signal can be prevented from being deteriorated.

As is clear from the description above, stabilized operation is possible without the need of adding a limiter to limit the modulation factor below 100% at the input stage.

For this reason, making use of the above feature, a PWM amplifier can also be used as a high efficient power amplifier.

Moreover, though in the above description a bias higher than a power source voltage is needed, if a bias below ground potential is needed, this can be accomplished by reversing the polarities of the diode and condenser. In the above embodiment, the output stage uses N-channel MOS FET's in a push-pull connection, but is not limited to it, obviously. Furthermore, transistors constituting the drive amplifier may have a Darlington connection as well as a complementary connection.

Many widely different embodiments of the present invention may be constructed without departing from the spirit and scope of the present invention. It should be understood that the present invention is not limited to the specific embodiments described in the specification, except as defined in the appended claims.

What is claimed is:

1. In a pulse-width modulating amplifier circuit of the type having drive circuits, a power amplifier receiving inputs from said drive circuits, and a filter demodulator connected to the output of said power amplifier, the improvement comprising:

first and second bootstrap circuits for providing a power voltage to one of said drive circuits; said first bootstrap circuit being connected between said power amplifier output and said one drive circuit; said second bootstrap circuit being connected between an output of said filter demodulator and said one drive circuit.

2. A pulse-width modulating amplifier circuit of claim 1, wherein said second bootstrap circuit comprises a storage capacitor having one end connected to said output of said filter demodulator; a diode having one end connected to said one drive circuit and the other end connected to the other end of said storage capacitor; and a series circuit of a second diode and a resistor connected between the other end of said first diode and a power supply terminal of said power amplifier.

3. A pulse-width modulating amplifier circuit of claim 2, further comprising a third diode connected between an output of said first bootstrap circuit and said one end of said diode, for preventing a current flow from said second bootstrap circuit to said first bootstrap circuit.

* * * * *